(12) United States Patent
Wyrzykowska et al.

(10) Patent No.: US 7,259,336 B2
(45) Date of Patent: Aug. 21, 2007

(54) TECHNIQUE FOR IMPROVING POWER AND GROUND FLOODING

(75) Inventors: Aneta Wyrzykowska, Dunrobin (CA); Herman Kwong, Kanata (CA); Luigi Difilippo, Kanata (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 272 days.

(21) Appl. No.: 10/861,387

(22) Filed: Jun. 7, 2004

(65) Prior Publication Data

US 2004/0216916 A1    Nov. 4, 2004

Related U.S. Application Data

(63) Continuation-in-part of application No. 10/101,211, filed on Mar. 20, 2002, which is a continuation-in-part of application No. 09/651,188, filed on Aug. 30, 2000, now Pat. No. 6,388,890.

(60) Provisional application No. 60/477,923, filed on Jun. 13, 2003, provisional application No. 60/212,387, filed on Jun. 19, 2000.

(51) Int. Cl.
    *H01R 12/04* (2006.01)
(52) U.S. Cl. .................. 174/262; 174/250; 257/778
(58) Field of Classification Search ........... 174/250, 174/262; 257/778
    See application file for complete search history.

(56) References Cited

U.S. PATENT DOCUMENTS

| | | | |
|---|---|---|---|
| 5,006,820 A | 4/1991 | Prioste et al. | |
| 5,281,151 A | 1/1994 | Arima et al. | |
| 5,451,721 A | 9/1995 | Tsukada et al. | |
| 5,544,018 A | 8/1996 | Sommerfeldt et al. | |
| 5,686,764 A | * 11/1997 | Fulcher | ............. 257/778 |
| 5,784,262 A | 7/1998 | Sherman | |
| 5,847,936 A | 12/1998 | Forehand et al. | |
| 6,181,004 B1 | 1/2001 | Koontz et al. | |

(Continued)

FOREIGN PATENT DOCUMENTS

EP    1 087 440 A2    3/2001

(Continued)

OTHER PUBLICATIONS

European Search Report dated Jun. 8, 2004 for Application No. EP 03 39 4085.

(Continued)

Primary Examiner—Tuan Dinh
Assistant Examiner—Abiy Getachew
(74) Attorney, Agent, or Firm—Hunton & Williams LLP (57)    ABSTRACT

A technique for improving power/ground flooding is disclosed. In one particular exemplary embodiment, the technique may be realized as a method for improving power and ground flooding in a multilayer circuit board, the multilayer circuit board having a plurality of signal layers. The method may comprise forming a plurality of electrically conductive vias, wherein each of the plurality of electrically conductive vias extends through one or more of the plurality of signal layers. The method may also comprise routing signals associated with the plurality of electrically conductive vias, thereby creating at least one power/ground flooding channel. The method may additionally comprise forming at least one power/ground connection within the at least one power/ground flooding channel.

14 Claims, 7 Drawing Sheets

U.S. PATENT DOCUMENTS

| | | |
|---|---|---|
| 6,194,668 B1 | 2/2001 | Horiuchi et al. |
| 6,198,635 B1 | 3/2001 | Shenoy et al. |
| 6,232,564 B1 | 5/2001 | Arndt et al. |
| 6,256,769 B1 | 7/2001 | Tamarkin et al. |
| 6,271,478 B1 | 8/2001 | Horiuchi et al. |
| 6,310,398 B1 | 10/2001 | Katz |
| 6,335,493 B1 | 1/2002 | Horiuchi et al. |
| 6,388,890 B1 | 5/2002 | Kwong et al. |
| 6,407,343 B1 | 6/2002 | Tanaka |
| 6,452,262 B1 | 9/2002 | Juneja |
| 6,489,574 B1 * | 12/2002 | Otaki et al. ................ 174/262 |
| 6,521,846 B1 | 2/2003 | Freda et al. |
| 6,707,685 B2 * | 3/2004 | Kabumoto et al. ......... 361/794 |
| 6,720,501 B1 * | 4/2004 | Henson ..................... 174/262 |
| 6,909,052 B1 * | 6/2005 | Haug et al. ................ 174/255 |
| 6,916,995 B2 * | 7/2005 | Seaman et al. ............. 174/255 |
| 2003/0043560 A1 | 3/2003 | Clarkson et al. |

FOREIGN PATENT DOCUMENTS

| | | |
|---|---|---|
| FR | 2782230 | 2/2000 |
| JP | H05-54103 | 3/1993 |
| JP | H07-141409 | 6/1995 |
| JP | H10-134098 | 5/1998 |
| JP | H11-297885 | 10/1999 |
| JP | 2001-034643 | 2/2001 |
| JP | 2001-274288 | 10/2001 |
| JP | 2001-351983 | 12/2001 |

OTHER PUBLICATIONS

European Search Report dated Jun. 8, 2004 for Application No. EP 03 39 4028.

Abstract of European Application No. 03394085.9.

* cited by examiner

TECHNIQUE FOR IMPROVING POWER AND GROUND FLOODING

CROSS-REFERENCE TO RELATED APPLICATIONS

This patent application claims priority to U.S. Provisional Patent Application No. 60/477,923, filed Jun. 13, 2003, which is hereby incorporated by reference herein in its entirety.

This patent application is a continuation-in-part of U.S. patent application Ser. No. 10/101,211, filed Mar. 20, 2002, which is a continuation-in-part of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000. All of these related patent applications are hereby incorporated by reference herein in their entirety.

FIELD OF THE DISCLOSURE

The present disclosure relates generally to electronic packaging and, more particularly, to a technique for improving power and ground flooding.

BACKGROUND OF THE DISCLOSURE

Multilayer circuit boards were developed to overcome area limitations associated with single-layered circuit boards. A multilayer circuit board can be either single- or double-sided, and may comprise multiple signal layers on the surface of and buried within the board. Such multilayer circuit boards have allowed a significant increase in the number of electrical signals that may be routed between electronic components mounted on the same circuit board. Thus, electronic components with a large number of input/output (I/O) pins may be mounted on a single circuit board. And sophisticated micro-systems may be delivered in multi-chip packages.

As the number of pin-outs increases, often accompanied by a decrease in pin pitch, it has become more and more difficult to achieve full power and ground flooding within a package. For example, due to high pin density, space limitations can make it impossible to route a trace to a power/ground pin. Even if a trace may be routed for a power/ground connection, it is often too thin for sufficient current to flow through. A high-density package also tends to have more severe electromagnetic interference (EMI) among its components. Sufficient ground flooding of the package is usually crucial to an effective containment of EMI.

Furthermore, high-density packages with multilayer circuit boards can produce a substantial amount of heat even during normal operations. Excessive heat tends to deteriorate the performance of electronic components and shorten their lifetime. Therefore, preventative measures become necessary to help dissipate excessive heat. However, space limitations within a multilayer circuit board often hinders the implementation of heat-dissipating measures.

Figure 1:
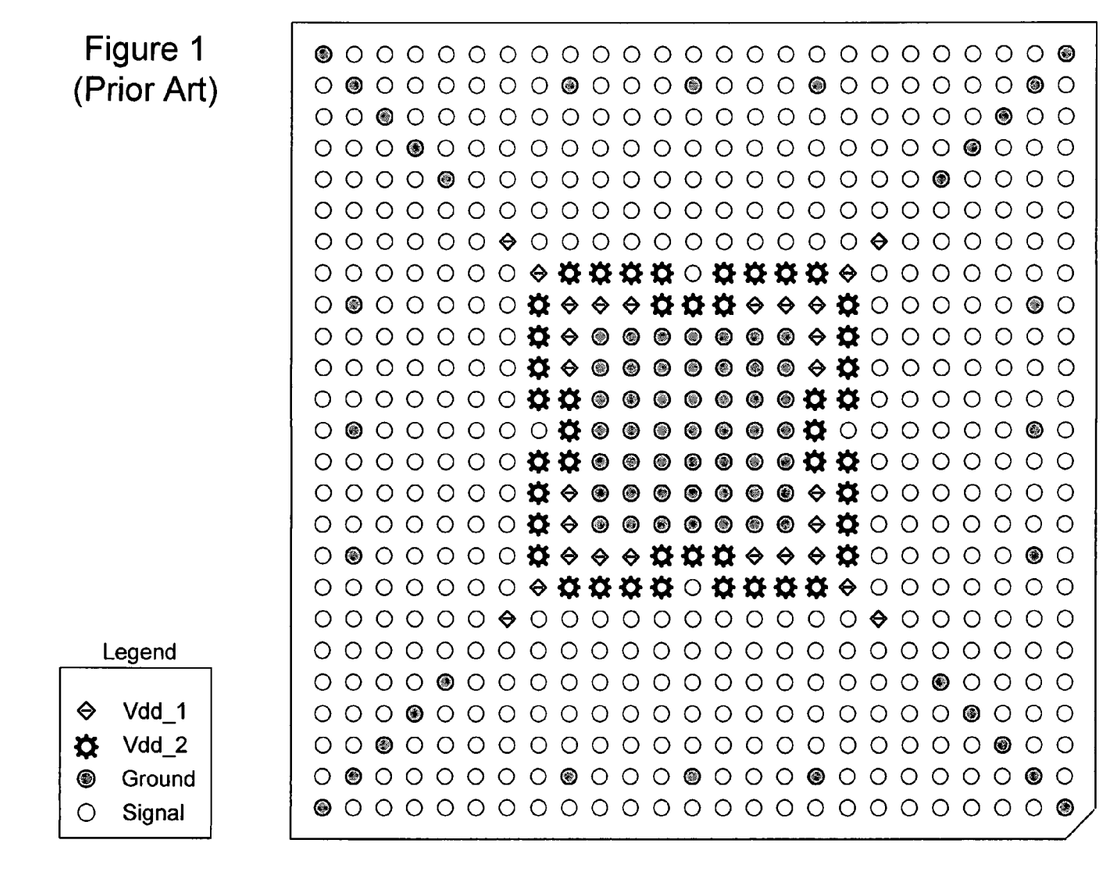
FIG. 1 shows a layout footprint of a surface mount grid array package which may result in inadequate ground flooding.

Referring to FIG. 1, there is shown a layout footprint of a surface mount grid array package having over two hundred I/O contacts. FIG. 1 also shows a legend indicating the type of signal associated with each I/O contact. These I/O contacts may be accommodated by corresponding vias extending into or through the multilayer circuit board. As shown, while some of the ground vias are clustered in the center, others are loosely scattered throughout the layout footprint.

Figure 2:
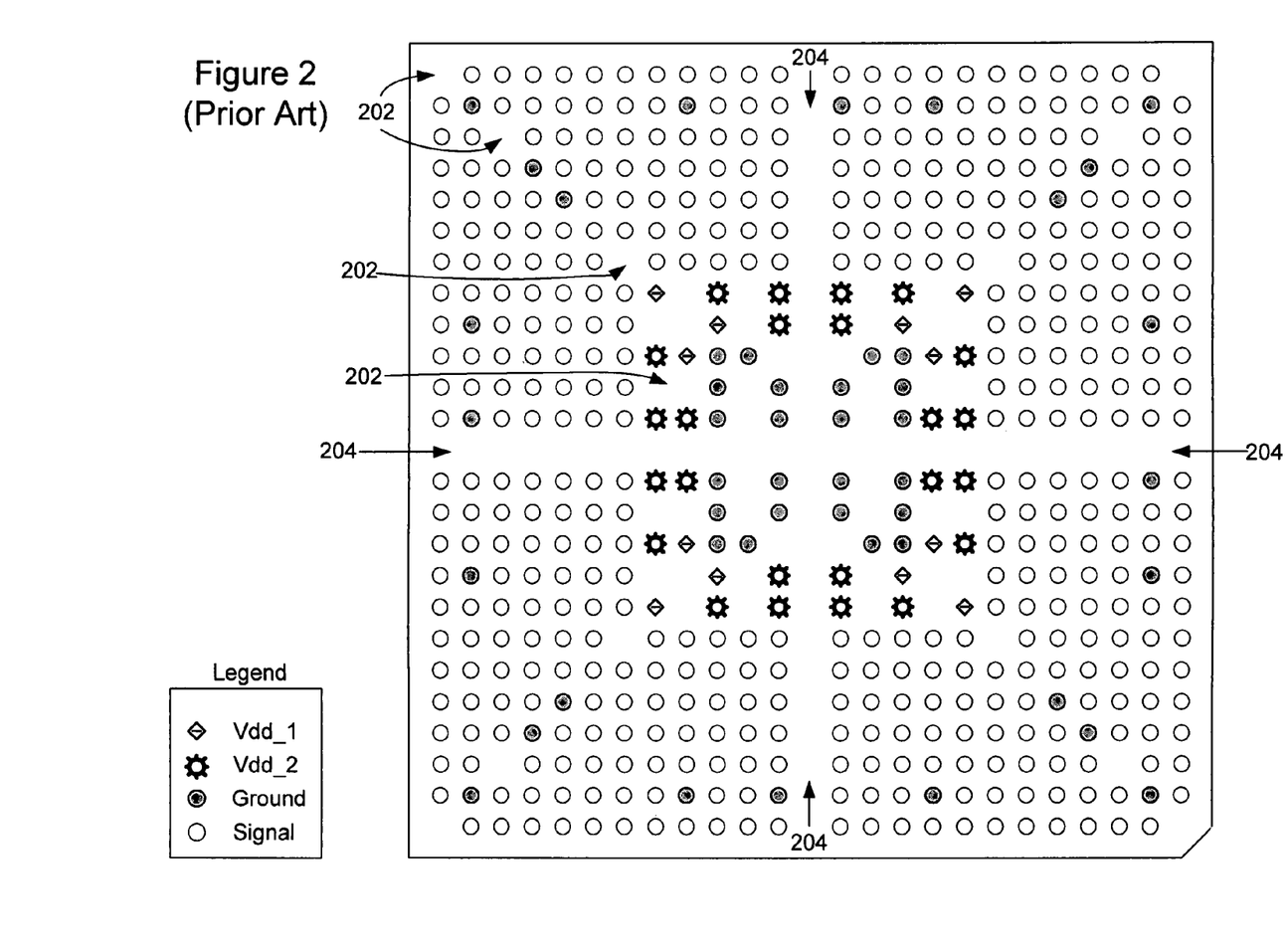
FIGS. 2 and 3 illustrate a prior art solution for ground flooding.
Figure 3:
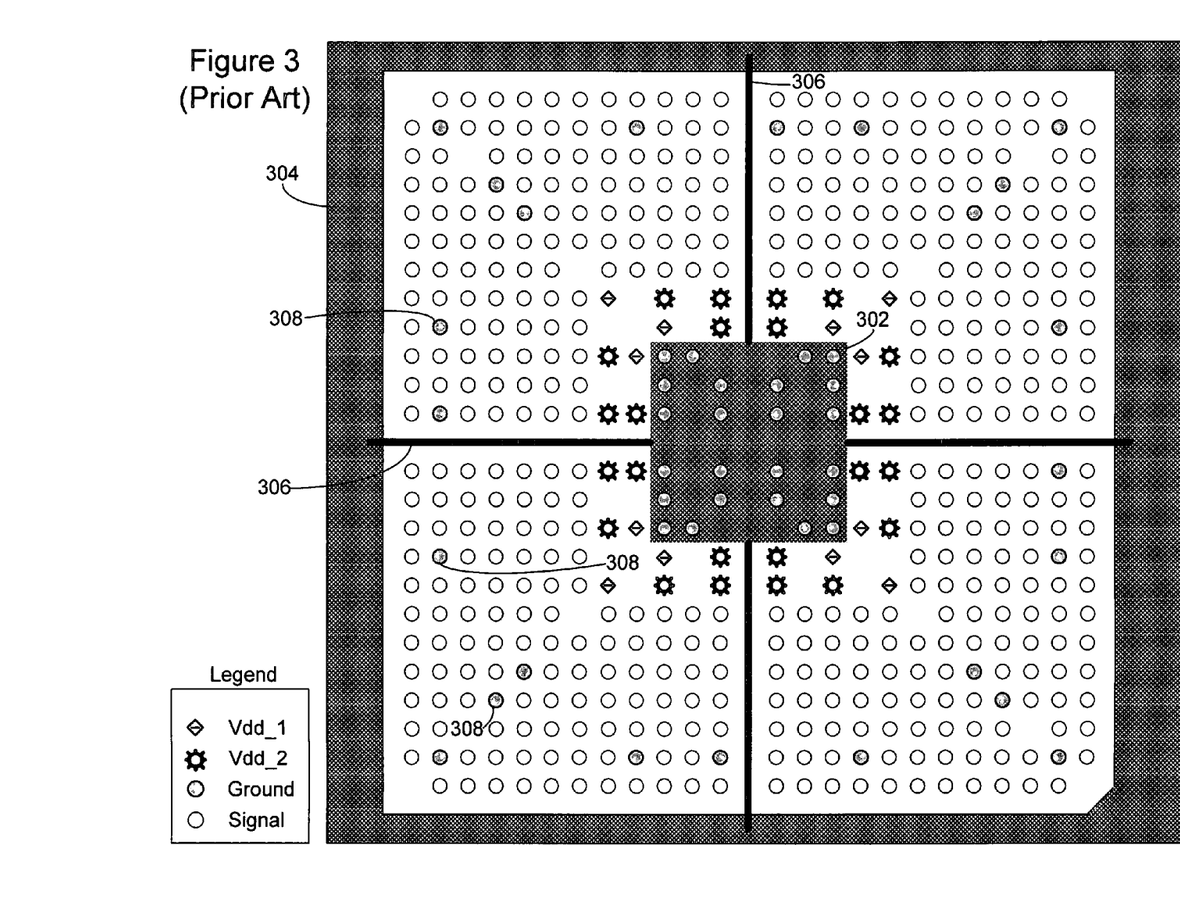

One prior art solution for providing ground flooding for the ground vias is illustrated in FIGS. 2 and 3. By applying the channel-routing techniques (e.g., dog-boning and power-sharing) described in earlier related patent applications, some vias may be re-arranged or removed, thereby creating via-free areas 202 and via-free channels 204 as illustrated in FIG. 2. Then, a center ground patch 302 may be formed to connect all the ground vias in the center cluster. Connection lines 306 may be provided to link the center ground patch 302 with a ground plane 304. Although this prior art solution may alleviate the above-described ground flooding deficiencies to some extent, full flooding is not achieved due to spacing setup. The connection lines 306 may be too thin to support the large currents required for ground flooding. And several ground vias 308 still do not have sufficient contact to the ground plane 304.

In view of the foregoing, it would be desirable to provide a solution for power and ground flooding in multilayer circuit boards which overcomes the above-described inadequacies and shortcomings.

SUMMARY OF THE DISCLOSURE

A technique for improving power and ground flooding is disclosed. In one particular exemplary embodiment, the technique may be realized as a method for improving power and ground flooding in a multilayer circuit board, the multilayer circuit board having a plurality of signal layers. The method may comprise forming a plurality of electrically conductive vias, wherein each of the plurality of electrically conductive vias extends through one or more of the plurality of signal layers. The method may also comprise routing signals associated with the plurality of electrically conductive vias, thereby creating at least one power/ground flooding channel. The method may additionally comprise forming at least one power/ground connection within the at least one power/ground flooding channel.

In accordance with other aspects of this particular exemplary embodiment, the at least one power/ground flooding channel may be substantially wider than a pitch between two adjacent electrically conductive vias.

In accordance with further aspects of this particular exemplary embodiment, the step of routing signals associated with the plurality of electrically conductive vias may comprise at least two stages of channel routing process.

In accordance with additional aspects of this particular exemplary embodiment, the signals associated with the plurality of electrically conductive vias may be routed within the multilayer circuit board, to and from at least one electronic component mounted on a surface of the multilayer circuit board, or to and from a second circuit board.

In accordance with a further aspect of this particular exemplary embodiment, the at least one power/ground connection may be terminated at a power/ground plane.

In accordance with a yet further aspect of this particular exemplary embodiment, the multilayer circuit board may comprise a power/ground patch, the power/ground patch having electrical contact with a plurality of power/ground vias. And the at least one power/ground connection may provide power/ground flooding for the power/ground patch.

In accordance with a still further aspect of this particular exemplary embodiment, the method may further comprise providing thermal dissipation and/or mechanical support for the multilayer circuit board based at least in part on the at least one power/ground flooding channel.

In another particular exemplary embodiment, the technique may be realized by a multilayer circuit board with improved power and ground flooding. The multilayer circuit board may comprise a plurality of signal layers. The multilayer circuit board may also comprise a plurality of electrically conductive vias, wherein each of the plurality of electrically conductive vias extends through one or more of the plurality of signal layers. The multilayer circuit board may additionally comprise at least one power/ground flooding channel, wherein the at least one power/ground flooding channel is created by routing signals associated with the plurality of electrically conductive vias. The multilayer circuit board may further comprise at least one power/ground connection formed within the at least one power/ground flooding channel.

In accordance with other aspects of this particular exemplary embodiment, the at least one power/ground flooding channel may be substantially wider than a pitch between two adjacent electrically conductive vias.

In accordance with further aspects of this particular exemplary embodiment, the at least one power/ground flooding channel may be created based on at least two stages of channel routing process.

In accordance with additional aspects of this particular exemplary embodiment, the signals associated with the plurality of electrically conductive vias may be routed within the multilayer circuit board, to and from at least one electronic component mounted on a surface of the multilayer circuit board, or to and from a second circuit board.

In accordance with a further aspect of this particular exemplary embodiment, the at least one power/ground connection may be terminated at a power/ground plane.

In accordance with a yet further aspect of this particular exemplary embodiment, the multilayer circuit board may comprise a power/ground patch, the power/ground patch having electrical contact with a plurality of power/ground vias. And the at least one power/ground connection may provide power/ground flooding for the power/ground patch.

In accordance with a still further aspect of this particular exemplary embodiment, the multilayer circuit board may further comprise one or more thermal dissipation and/or mechanical support structures for the multilayer circuit board based at least in part on the at least one power/ground flooding channel.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENT(S)

Figure 4:
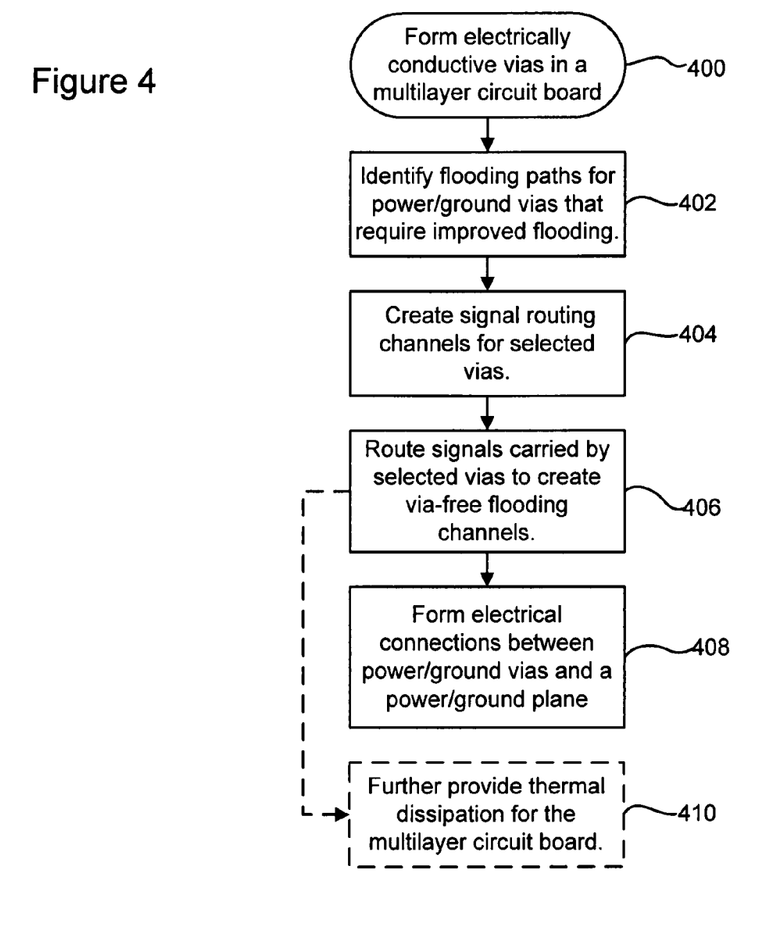
FIG. 4 is a flow chart illustrating an exemplary method for improving power and ground flooding in accordance with an embodiment of the present disclosure.

Referring to FIG. 4, there is shown a flow chart illustrating an exemplary method for improving power and ground flooding in accordance with an embodiment of the present disclosure.

In step 400, a plurality of electrically conductive vias may be formed in a multilayer circuit board. The multilayer circuit board may comprise a number of layers that are electrically isolated from one another. Different layers inside a multilayer circuit board may be adapted to different functions. For example, a multilayer circuit board may have a primary (top) layer and a secondary (bottom) layer. These layers are usually adapted to have one or more electrical components mounted thereon. Some layers are implemented primarily for routing signals other than power or ground signals, such as test signals, clock signals, etc. And some layers serve the main purpose of routing power and/or ground signals. All these layers in a multilayer circuit board may be collectively referred to as "signal layers."

Depending on the needs for signal routing and the mounted electronic component, electrically conductive vias may be formed in the circuit board. Some vias (i.e., supervias) may be thru-holes extending from one surface of the circuit board to the opposite surface. Some vias (i.e., microvias or blind vias) may connect two or more of the signal layers without extending through the whole circuit board. Other vias, such as buried vias, may connect two or more signal layers without extending to either surface of the circuit board. Based on the type of signal associated therewith, a via may be categorized as a signal via (for signals other than power or ground) or a power/ground via (for power or ground signals), for example.

In step 402, one or more flooding paths may be identified for power/ground vias that require improved flooding. In a high-density multilayer circuit board, flooding problems may be identified for portions of the board that are affected by large current, excessive heat and/or EMI. Since power/ground flooding is typically implemented to provide sufficient contact to a power/ground plane, it may be desirable to identify flooding paths in a power/ground layer that would provide effective power/ground access to power/ground vias that require flooding. A flooding path is typically of sufficient width to accommodate placement of connections carrying large currents.

Once the flooding paths have been identified in the power/ground layer, it may be necessary to clear these paths for subsequent signal routing processes. That is, selected vias may need to be removed or relocated from the flooding paths. Thus, in step 404, signal routing channels may be created for the selected vias in some other signal layers. Creation of these via-free channels may be based on the channel routing techniques disclosed in the related patent applications which are incorporated herein in their entirety.

In step 406, signals associated with the selected vias may be routed to create via-free flooding channels in the power/ground layer. Step 406 may be another channel routing step utilizing the via-free signal routing channels created in step 404. It may be beneficial to implement two or more stages of a channel routing process, each stage creating signal routing channels for a next stage. As a result, via-free flooding channels of sufficient width may be created.

In step 408, electrical connections may be formed in the via-free flooding channels, interconnecting the power/ground vias with the power/ground plane. The electrical connections may be wires or bands formed out of highly conductive metal such as copper, aluminum, platinum or gold.

The electrical connections for power/ground flooding may, to some extent, relieve the problem of excessive heat. Optionally, in step 410, thermal dissipation measures may be provided for the multilayer circuit board based on the via-free flooding channels. For example, structures comprising thermally conductive materials may be formed in the flooding channels to help dissipate excessive heat.

Figure 5:
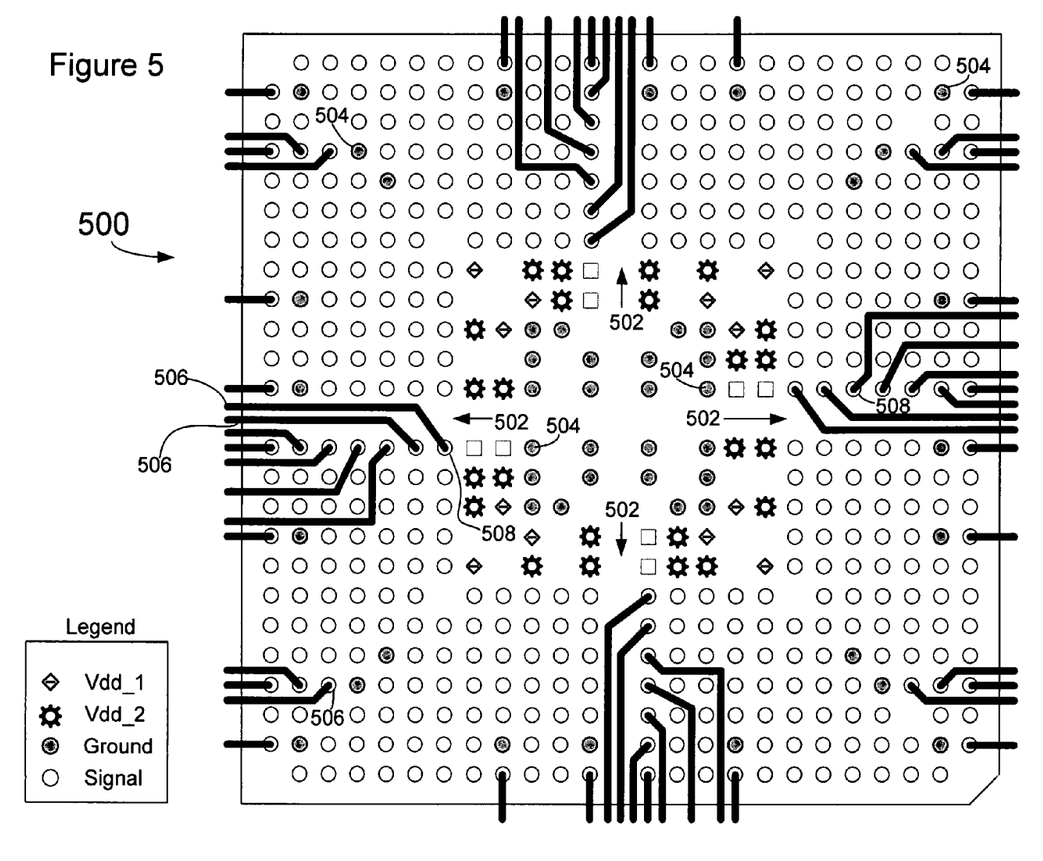
FIG. 5 illustrates a first signal layer in a multilayer circuit board where an exemplary method for improving ground flooding is implemented in accordance with an embodiment of the present disclosure.
Figure 6:
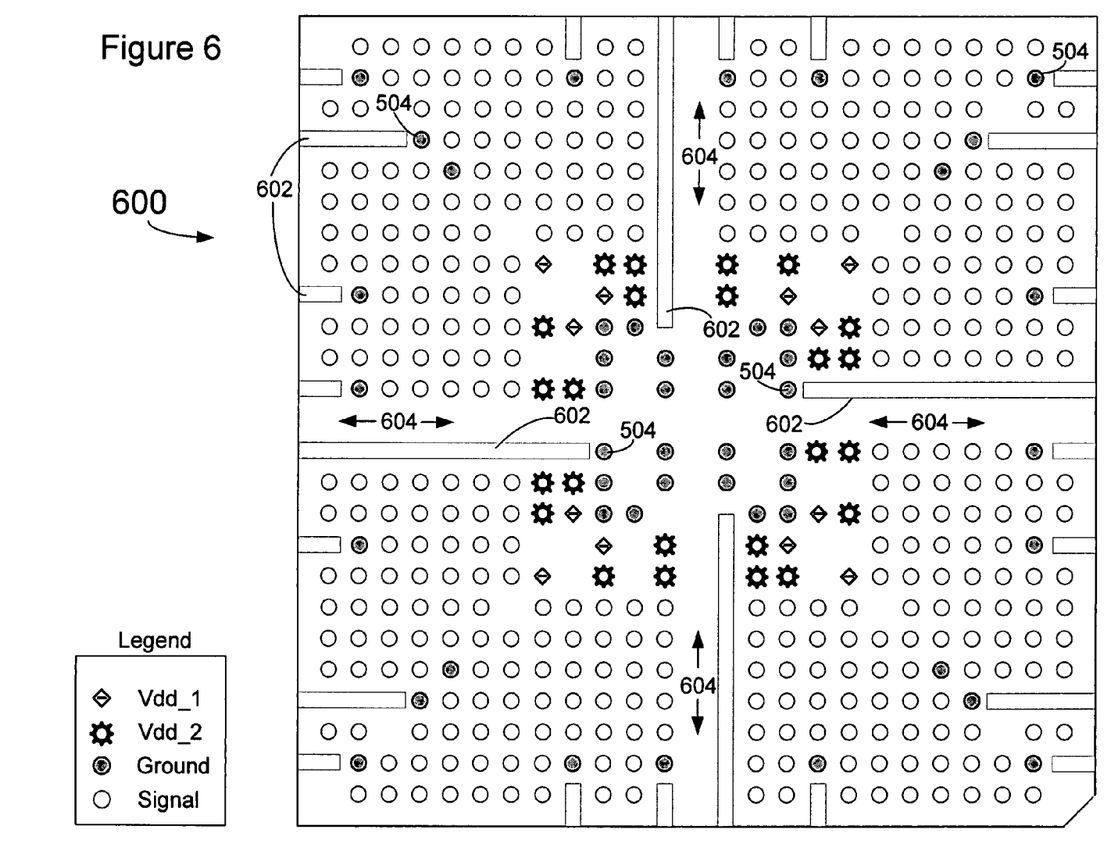
FIG. 6 illustrates a second signal layer in the multilayer circuit board where the exemplary method for improving ground flooding is implemented.
Figure 7:
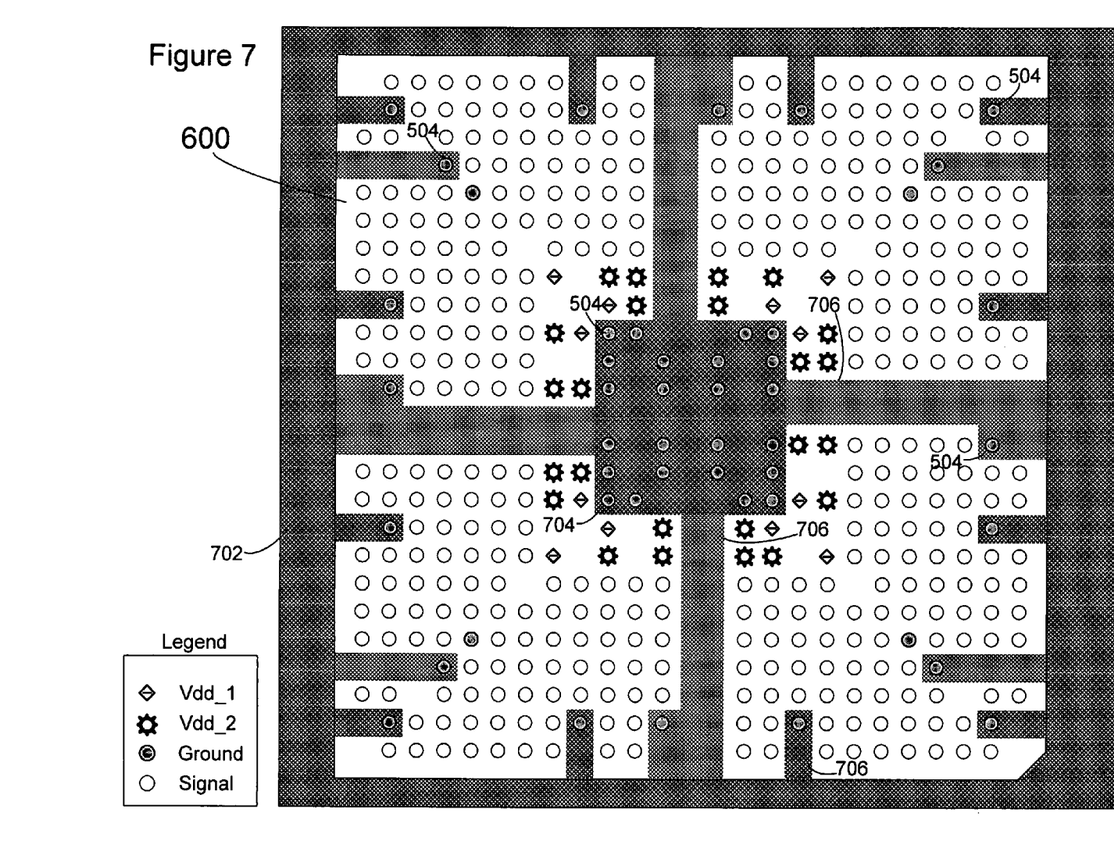
FIG. 7 illustrates the second signal layer in the multilayer circuit board where the exemplary method for improving ground flooding is implemented.

FIGS. 5-7 illustrate one exemplary method for improving ground flooding in accordance with an embodiment of the present disclosure. FIG. 5 illustrates a first signal layer 500 in a multilayer circuit board. The first signal layer may be one adjacent to or close to a second signal layer 600 shown in FIGS. 6 and 7.

As shown in FIG. 5, via-free signal routing channels 502 have been created based on channel routing techniques. The via-free routing channels 502 may be further utilized to route signals associated with those vias 508 located in flooding paths of the power/ground vias 504. Two or more wire traces 506 may be routed in each of the via-free routing channels 502.

As a result of the signal routing in the first signal layer 500, additional via-free channels 602 may be created in corresponding locations in the second signal layer 600 shown in FIG. 6. These additional via-free channels 602, together with previously formed via-free channels 604, may form ground flooding channels for the ground vias 504. Typically, these flooding channels are substantially wider than the normal pitch between two adjacent vias. Thus, thick metal wires or bands may be routed in the flooding channels to carry large currents. Alternatively, at least some of the space in the flooding channels may be utilized to implement heat-dissipating measures.

FIG. 7 shows the second signal layer 600 with improved ground flooding. The signal layer 600 may be in contact with a ground plane 702. A center ground patch 704 may be provided to connect the ground vias 504 that are clustered near the center of the layer 600. Wide metal wires or bands 706 may be formed to interconnect the center ground patch 704 or ground vias 504 with the ground plane 702. Alternatively, these metal wires may be viewed as extensions of the ground plane. As a result, almost all the ground vias, not only those located in the center but also those scattered in the peripheral, can have adequate flooding. The improved flooding may in turn insure signal integrity within the package footprint. According to embodiments of the disclosure, the wide metal bands may also improve heat dissipation because of increased metal materials beneath high-power devices. Further, this technique may be helpful in achieving a better mechanical support for co-planarity sensitive devices.

Although FIGS. 5-7 illustrate an exemplary method for improving ground flooding, it should be appreciated that the technique disclosed therein is also applicable to power flooding.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the following appended claims. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A method for improving power and ground flooding in a multilayer circuit board, the multilayer circuit board having a plurality of signal layers, the method comprising the steps of:

forming a plurality of electrically conductive vias, wherein each of the plurality of electrically conductive vias extends through one or more of the plurality of signal layers;

routing signals associated with the plurality of electrically conductive vias, thereby creating at least one power/ground flooding channel; and forming at least one power/ground connection within the at least one power/ground flooding channel;

wherein the at least one power/ground flooding channel is substantially wider than a pitch between two adjacent electrically conductive vias.

2. The method according to claim 1, wherein the step of routing signals associated with the plurality of electrically conductive vias comprises at least two stages of channel routing process.

3. The method according to claim 1, wherein the signals associated with the plurality of electrically conductive vias are routed in at least one of the following manners:

within the multilayer circuit board;

to and from at least one electronic component mounted on a surface of the multilayer circuit board; and to and from a second circuit board.

4. The method according to claim 1, wherein the at least one power/ground connection is terminated at a power/ground plane.

5. A method for improving power and ground flooding in a multilayer circuit board, the multilayer circuit board having a plurality of signal layers, the method comprising the steps of:

forming a plurality of electrically conductive vias, wherein each of the plurality of electrically conductive vias extends through one or more of the plurality of signal layers;

routing signals associated with the plurality of electrically conductive vias, thereby creating at least one power/ground flooding channel; and forming at least one power/ground connection within the at least one power/ground flooding channel;

wherein the multilayer circuit board comprises a power/ground patch, the power/ground patch having electrical contact with a plurality of power/ground vias, and the at least one power/ground connection providing power/ground flooding for the power/ground patch.

6. The method according to claim 1 further comprising providing thermal dissipation for the multilayer circuit board based at least in part on the at least one power/ground flooding channel.

7. The method according to claim 1 further comprising providing mechanical support for the multilayer circuit board based at least in part on the at least one power/ground flooding channel.

8. A multilayer circuit board with improved power and ground flooding, the multilayer circuit board comprising:
a plurality of signal layers;
a plurality of electrically conductive vias, wherein each of the plurality of electrically conductive vias extends through one or more of the plurality of signal layers;
at least one power/ground flooding channel, wherein the at least one power/ground flooding channel is created by routing signals associated with the plurality of electrically conductive vias; and
at least one power/ground connection formed within the at least one power/ground flooding channel;
wherein the at least one power/ground flooding channel is substantially wider than a pitch between two adjacent electrically conductive vias.

9. The multilayer circuit board according to claim 8, wherein the at least one power/ground flooding channel is created based on at least two stages of channel routing process.

10. The multilayer circuit board according to claim 8, wherein the signals associated with the plurality of electrically conductive vias are routed in at least one of the following manners:

within the multilayer circuit board;
to and from at least one electronic component mounted on a surface of the multilayer circuit board; and
to and from a second circuit board.

11. The multilayer circuit board according to claim 8, wherein the at least one power/ground connection is terminated at a power/ground plane.

12. A multilayer circuit board with improved power and ground flooding, the multilayer circuit board comprising:
a plurality of signal layers;
a plurality of electrically conductive vias, wherein each of the plurality of electrically conductive vias extends through one or more of the plurality of signal layers;
at least one power/ground flooding channel, wherein the at least one power/ground flooding channel is created by routing signals associated with the plurality of electrically conductive vias; and
at least one power/ground connection formed within the at least one power/ground flooding channel;
wherein the multilayer circuit board comprises a power/ground patch, the power/ground patch having electrical contact with a plurality of power/ground vias, and the at least one power/ground connection providing power/ground flooding for the power/ground patch.

13. The multilayer circuit board according to claim 8 further comprising one or more thermal dissipation structures based at least in part on the at least one power/ground flooding channel.

14. The multilayer circuit board according to claim 8 further comprising one or more mechanical support structures based at least in part on the at least one power/ground flooding channel.

* * * * *